(12) United States Patent
Kuwahara et al.

(10) Patent No.: US 11,651,930 B2
(45) Date of Patent: *May 16, 2023

(54) SPATIALLY PHASE-MODULATED ELECTRON WAVE GENERATION DEVICE

(71) Applicant: Hitachi High-Tech Corporation, Tokyo (JP)

(72) Inventors: Makoto Kuwahara, Nagoya (JP); Koh Saitoh, Nagoya (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/540,442

(22) Filed: Dec. 2, 2021

(65) Prior Publication Data

US 2022/0104159 A1 Mar. 31, 2022

Related U.S. Application Data

(63) Continuation of application No. 16/966,103, filed as application No. PCT/JP2019/001715 on Jan. 21, 2019, now Pat. No. 11,232,927.

(30) Foreign Application Priority Data

Feb. 1, 2018 (JP) ................................ 2018-016410

(51) Int. Cl.
*H01J 37/073* (2006.01)
*H01J 37/10* (2006.01)
(Continued)

(52) U.S. Cl.
CPC ............ *H01J 37/073* (2013.01); *H01J 37/10* (2013.01); *H01J 37/153* (2013.01); *H01J 37/26* (2013.01);
(Continued)

(58) Field of Classification Search
CPC ........ H01J 37/073; H01J 37/10; H01J 37/153; H01J 37/26; H01J 2237/1534; H03F 1/02;
(Continued)

(56) References Cited

U.S. PATENT DOCUMENTS 5,841,489 A   11/1998  Yoshida et al.
5,932,966 A    8/1999  Schneider et al.
(Continued)

FOREIGN PATENT DOCUMENTS

JP          6-51340 A    2/1994
JP     2004-506296 A    2/2004
(Continued)

OTHER PUBLICATIONS

International Search Report (PCT/ISA/210) issued in PCT Application No. PCT/JP2019/001715 dated Apr. 2, 2019 with English translation (three (3) pages).
(Continued)

*Primary Examiner* — Nicole M Ippolito
*Assistant Examiner* — Hanway Chang
(74) *Attorney, Agent, or Firm* — Crowell & Moring LLP

(57) ABSTRACT

The present invention is to generate a spatially phase modulated electron wave. A laser radiating apparatus, a spatial light phase modulator, and a photocathode are provided. The photocathode has a semiconductor film having an NEA film formed on a surface thereof, and a thickness of the semiconductor film is smaller than a value obtained by multiplying a coherent relaxation time of electrons in the semiconductor film by a moving speed of the electrons in the semiconductor film. According to the configuration, a spatial distribution of phase and a spatial distribution of intensity of spatial phase modulated light are transferred to an electron wave, and the electron wave emitted from an NEA film is modulated into the spatial distribution of phase and the
(Continued)

US 11,651,930 B2
Page 2 spatial distribution of intensity of the light. Since the spatial distribution of phase of the light can be modulated as intended by a spatial phase modulation technique for light, it is possible to generate an electron wave having a spatial distribution of phase modulated as intended.

8 Claims, 9 Drawing Sheets

(51) Int. Cl.
| | |
|---|---|
| H01J 37/153 | (2006.01) |
| H01J 37/26 | (2006.01) |
| H03F 1/02 | (2006.01) |
| H03F 3/24 | (2006.01) |
| H04B 1/04 | (2006.01) |
| H04L 25/03 | (2006.01) |
| H04L 27/08 | (2006.01) |
| H04L 27/26 | (2006.01) |
| H04L 27/36 | (2006.01) |
| H04W 56/00 | (2009.01) |
| H04W 74/00 | (2009.01) |
| H04W 88/02 | (2009.01) |
| H04W 88/08 | (2009.01) |

(52) U.S. Cl.
CPC ............... *H03F 1/02* (2013.01); *H03F 3/24* (2013.01); *H04B 1/04* (2013.01); *H04L 25/03012* (2013.01); *H04L 25/03343* (2013.01); *H04L 27/08* (2013.01); *H04L 27/2647* (2013.01); *H04L 27/368* (2013.01); *H04W 56/0035* (2013.01); *H01J 2237/1534* (2013.01); *H04B 2001/045* (2013.01); *H04B 2001/0408* (2013.01); *H04W 74/004* (2013.01); *H04W 74/006* (2013.01); *H04W 88/02* (2013.01); *H04W 88/08* (2013.01)

(58) Field of Classification Search
CPC ..... H03F 3/24; H04B 1/04; H04B 2001/0408; H04B 2001/045; H04L 25/03343; H04L 27/08; H04L 27/2647; H04L 27/268; H04W 56/0035; H04W 74/004; H04W 74/006; H04W 88/02; H04W 88/08
See application file for complete search history.

(56) References Cited

U.S. PATENT DOCUMENTS

| | | | |
|---|---|---|---|
| 6,828,574 | B1 | 12/2004 | Allen |
| 11,232,927 | B2 * | 1/2022 | Kuwahara ............... H04L 27/08 |

FOREIGN PATENT DOCUMENTS

| | | |
|---|---|---|
| JP | 2010-218868 A | 9/2010 |
| JP | 2013-244527 A | 12/2013 |
| WO | WO 2017/168554 A1 | 10/2017 |

OTHER PUBLICATIONS

Japanese-language Written Opinion (PCT/ISA/237) issued in PCT Application No. PCT/JP2019/001715 dated Apr. 2, 2019 (four (4) pages).
Kondoh et al., "Optical Modulation of Electron Beam on a Photocathode RF Gun Toward the IMRT", Proceedings of the 4$^{th}$ Annual Meeting of Particle Accelerator Society of Japan and the 32$^{nd}$ Linear Accelerator Meeting in Japan, Aug. 1-3, 2007, pp. 185-187, Wako, JP, with English abstract (three (3) pages).
Kashima et al., "Development of Optical Control Technology of Electron Beam for Medical Application", Proceedings of the 4$^{th}$ Annual Meeting of Particle Accelerator Society of Japan and the 32$^{nd}$ Linear Accelerator Meeting in Japan. Aug. 1-3. 2007, pp. 721-723, Wako, JP, with English abstract (three (3) pages).
European Search Report issued in European Application No. 19748111.2 dated May 7, 2021 (eight (8) pages).
European Office Action issued in European Application No. 19748111.2 dated May 21, 2021 (eight (8) pages).
Nishitani et al, "Highly Polarized Electrons from GaAs—GaAsP and InGaAs—AlGaAs Strained-Layer Superlattice Photocathodes", Journal of Applied Physics, Apr. 20, 2005, pp. 94907-1 to 94907-6, vol. 97., No.9, XP12071255 (six (6) pages).

* cited by examiner

SPATIALLY PHASE-MODULATED ELECTRON WAVE GENERATION DEVICE

CROSS REFERENCE TO RELATED APPLICATIONS

This application is a continuation of U.S. patent application Ser. No. 16/966,103, filed Jul. 30, 2020, which is a national stage entry of PCT International Application No. PCT/JP2019/001715, filed Jan. 21, 2019, which claims priority under 35 U.S.C. § 119 from Japan Patent Application No. 2018-016410, filed Feb. 1, 2018, the entire disclosures of which are herein expressly incorporated by reference.

TECHNICAL FIELD

The present specification discloses a technique for generating an electron wave having a spatial distribution of phase modulated as intended or an electron wave having both a spatial distribution of phase and a spatial distribution of intensity modulated as intended (hereinafter, collectively referred to as spatially phase modulated electron wave). Further, the present specification discloses a technique for using a spatially phase modulated electron wave.

BACKGROUND ART

A technique for spatial phase modulation with respect to light is put into practical use (Patent Literature 1), and it is possible to obtain a light having a spatial distribution of phase modulated as intended or a light having both a spatial distribution of phase and a spatial distribution of intensity modulated as intended. Performing the spatial phase modulation on light enables various usage, such as modulating an intensity distribution of a light beam (intensity distribution on an irradiation surface) as intended (called beam shaping), minimization of aberration due to a converging optical system, generation of ultrashort pulsed light (called optical pulse shaping), and the like. Further, it is possible to achieve a finer resolution of an optical microscope.

PRIOR ARTS

Patent Literature

Patent Literature 1: JP-A-06-051340
Patent Literature 2: JP-T-2004-506296

Non-Patent Literature

Non-Patent Literature 1: T. Kondoh et al., Proc. PASJ4/LAM32, pp 185-187, Aug. 1-3, 2007
Non-Patent Literature 2: H. Kashima et al., Proc. PASJ4/LAM32, pp 721-723, Aug. 1-3, 2007

SUMMARY OF INVENTION

Problem to be Solved

Patent Literature 2, Non-Patent Literature 1, and Non-Patent Literature 2 disclose techniques for generating an electron wave with a spatial distribution of intensity modulated. However, the related art described above is to modulate the spatial distribution of intensity of the electron wave, and cannot modulate spatial distribution of phase of the electron wave.

If it is possible to obtain an electron wave having spatial distribution of phase modulated as intended, or an electron wave having both a spatial distribution of phase and a spatial distribution of intensity modulated as intended, various utilization methods are possible similar to the case of the spatial phase modulated light. However, at present, no suitable methods for obtaining a spatially phase modulated electron wave are known. The only known method is to insert a phase plate affecting a phase of a transmitted electron wave into a traveling path of the electron wave.

The method of inserting a phase plate has various problems. For example, the phase plate reduces an available probe current. Since it is difficult to separate the intensity modulation and the phase modulation, it is difficult to modulate both the phase and the intensity to an intended distribution state. When the phase plate is charged up, modulation capability thereof may be changed, or the phase plate may be damaged, which requires frequent replacement of the phase plate. Alternatively, a diffraction phenomenon due to an edge of the phase plate and generation of a diffraction pattern due to an atomic structure of the phase plate are also problems.

The specification discloses a technique for generating a spatially phase modulated electron wave without using a phase plate.

Means for Solving the Problem

An electron wave generation apparatus disclosed in the specification includes a laser radiating apparatus, a spatial light phase modulator, and a photocathode. The photocathode includes a semiconductor film including an NEA film formed on a surface thereof, and a thickness of the semiconductor film is smaller than a value of multiplication of a coherent relaxation time of electrons in the semiconductor film and a moving speed of the electrons in the semiconductor film.

The spatial light phase modulator receives a laser radiated from the laser radiating apparatus, spatially phase modulates the laser, and radiates the spatially phase modulated laser toward the semiconductor film. When the laser spatially phase modulated by the spatial light phase modulator is directed into the semiconductor film (irradiating the semiconductor film), a spatial distribution of phase of the spatial phase modulated laser is transferred to an electron wave, and the electron wave emitted from the semiconductor film is modulated as the spatial distribution of phase of the laser. Since the spatial phase modulation technique for light that has already been developed can be used to modulate the spatial distribution of phase of the laser as intended, according to the above, it is possible to generate an electron wave with the spatial distribution of phase modulated as intended.

When both of the spatial distribution of phase and the spatial distribution of intensity of the laser incoming to the semiconductor film are modulated, both the spatial distribution of phase and the spatial distribution of intensity of the electron wave emitted from the semiconductor film correspond thereto.

As the spatial light phase modulator, for example, a spatial light phase modulation apparatus employing a liquid crystal panel and a controller thereof, such as KK LCOS-SLM (Liquid Crystal on Silicon-Spatial Light Modulator) X10468 series produced by Hamamatsu Photonics, can be used. Technical description of the apparatus can be found at https://www.hamamatsu.com/resources/pdf/ssd/12_handbook.pdf. The spatial light phase modulator can also be implemented by a dielectric that transmits light. By selecting a position, a thickness, a material, or the like of the dielectric, the spatial distribution of phase of the light can be modulated as intended. Compared to the case where the phase plate is inserted into the traveling path of the electron wave, the problem caused by inserting a transparent dielectric in the traveling path of the laser is small.

As spatial light phase modulator, both one with which a modulated distribution state is constant with respect to passage of time and one with which a modulated distribution state changes with passage of time can be used.

The NEA film usually refers to a film that implements negative electron affinity. That is, the NEA film refers to a film that implements a relationship such that a vacuum level is lower than a bottom of a conduction band in observing electrons on a semiconductor surface. In this case, electrons excited from a valence band into the conduction band can transit to the vacuum level without any obstacle. That is, electrons excited in the conduction band at room temperature or lower temperature are emitted from the semiconductor into vacuum. This is called the negative electron affinity.

Practically, if electrons having an energy higher than the bottom of the conduction band by about 36 millielectron volt (meV) are emitted into vacuum, an electron wave having a practical intensity can be obtained. Any film that brings a vacuum level lower than the energy level higher than the bottom of the conduction band by 36 meV can be used as the NEA film. The NEA film referred to in the specification includes not only those having a vacuum level lower than the bottom of the conduction band but also those having a vacuum level lower than the energy level higher than the bottom of the conduction band by 36 meV.

The present apparatus generates a spatially phase modulated electron wave without employing a phase plate, but is not one that cannot be used together with a phase plate, and does not exclude a combination thereof with a phase plate.

The electron wave having a modulated spatial distribution of phase includes an electron wave whose spatial distribution of phase is not uniform but whose spatial distribution of intensity is uniform (electron wave of which only a spatial distribution of phase is modulated), and an electron wave whose both spatial distribution of phase and spatial distribution of intensity are not uniform (electron wave of which both a spatial distribution of phase and a spatial distribution of intensity are modulated).

Advantageous Effect

The apparatus and methods described in the specification enable generation of a spatially phase modulated electron wave, and open up various possibilities exemplified below.

It becomes possible to obtain an electron wave having a spatial distribution of phase that is modulated as intended.

By using the electron wave, it becomes possible to observe with an electron microscope a sample that has a weak interaction with the electron wave (for example, living cells) or a sample that is easily damaged by the electron wave. A new phase-contrast electron microscope can be realized.

By obtaining the phase modulated electron wave, it becomes possible to obtain an electron wave beam having an adjusted spatial distribution of intensity at a high efficiency. For example, a structured illumination technique can be introduced into an electron microscope using an electron wave beam adjusted to a stripe-shaped intensity distribution.

By using the electron wave, it becomes possible to capture an electron microscope image that is suitable for an image analysis technique to be applied, such as a phase retrieval method.

By using the electron wave, a phase condition can be introduced into an image analysis technique such as a compressed sensing method, and an image analysis time can be shortened.

By using the electron wave, it becomes possible to generate a microwave or a terahertz wave having a modulated spatial distribution of phase by combining with a microwave generation apparatus or a terahertz wave generation apparatus. As a result, it is possible to increase a density of the microwave or the terahertz wave, and transport efficiency by a waveguide is improved.

An electron wave having a spatial distribution of phase that changes with passage of time (electron wave) can be obtained.

By using the electron wave, it becomes possible to perform observation using a vortex electron wave having an angular momentum.

Electron wave tweezers that can rotate particles can be implemented.

By using the electron wave, it is possible to read and store quantum information.

DESCRIPTION OF EMBODIMENTS

Technical features of embodiments described below will be listed.

(Feature 1) A semiconductor film having a strained superlattice structure of GaAs and GaAsP is used as a photocathode.

(Feature 2) On a surface of the semiconductor film, a NEA surface is formed, which emits electrons having an energy of 36 millielectron volt (meV) to a vacuum environment, with a bottom of a conduction band of a semiconductor (of the semiconductor film) as a reference for an energy level (Feature 3) An electrode that accelerates electrons near the NEA surface toward a sample is provided.

(Feature 4) A spatial light phase modulator is employed, which can modulate a spatial distribution of phase or both the spatial distribution of phase and a spatial distribution of intensity to any (intended) distribution state.

(Feature 5) A spatial light phase modulator is employed, which can change the spatial distribution of phase or both the spatial distribution of phase and the spatial distribution of intensity with passage of time.

EMBODIMENTS

Figure 1:
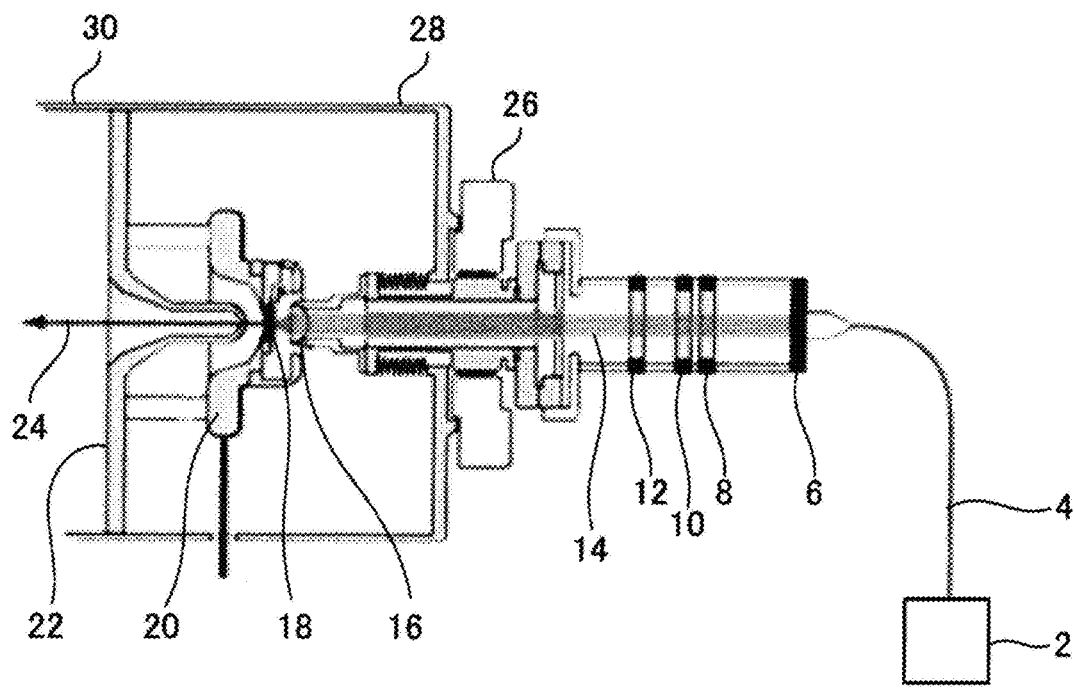
FIG. 1 shows an apparatus for generating a spatially phase modulated electron wave according to Embodiment 1.

FIG. 1 shows an electron wave generation apparatus according to Embodiment 1. A reference numeral 2 denotes a laser radiating apparatus, 4 denotes an optical fiber, 6 denotes a collimator lens, 8 and 10 denote polarization optical elements, 12 denotes a spatial light phase modulator, 16 denotes a focusing lens, and 26 denotes a housing for supporting the above optical apparatus. A reference numeral 14 denotes a laser having a spatial distribution of phase modulated as intended by the spatial light phase modulator 12.

A reference numeral 28 denotes a casing of an electron gun portion, 30 denotes a lens barrel of an electron microscope, 18 denotes a photocathode, and 20 and 22 denote an electrode pair that accelerates electrons. When the housing 26 is fixed to the casing 28 of the electron gun portion, the apparatus is adjusted to a position in which the spatial phase modulated laser 14 irradiates a back surface of the photocathode 18. A potential difference is applied between the electrode pair 20 and 22, and one electrode 20 also has a function of supporting the photocathode 18.

When the laser 14 irradiates the back surface of the photocathode 18, an electron wave 24 is emitted from a front surface of the photocathode 18 and is accelerated by the electrode pair 20 and 22 toward a sample (not shown). A spatial distribution of phase of the electron wave 24 emitted from the photocathode 18 is equal to a spatial distribution of phase of the laser 14 that is spatially phase modulated by the spatial light phase modulator 12. The spatial distribution of phase of the electron wave 24 has a relationship of transferring to the spatial distribution of phase of the laser 14.

The photocathode 18 is formed of a semiconductor film having a strained superlattice structure composed of GaAs and GaAsP, whose front surface (left side surface in FIG. 1) is coated with an NEA film and whose back surface (right side surface) is not covered with an NEA film. When the semiconductor film is irradiated with laser, an electron wave is emitted from the NEA film side of the semiconductor film. Details thereof are described in JP-A-2007-258119, and a repetitive description thereof is omitted. When the semiconductor film having the strained superlattice structure is irradiated with circularly polarized laser, a polarized electron wave having a specific preference of spin direction is obtained. The spin direction of the emitted electrons is determined by the direction of the circularly polarized light, and when the direction of circularly polarized light is reversed, the spin direction of the polarized electron wave is reversed. Details thereof are described in WO 2011/122171, and a repetitive description thereof is omitted. Details of a material of the NEA film or a method of forming the film are also described in the above two publications, and a repetitive description thereof is omitted. The electron wave emitted from the semiconductor film irradiated with the laser is coherent, which is confirmed to generate interference fringes (APPLIED PHYSICS LETTERS 105, 193101(2014), Coherence of a spin-polarized electron beam emitted from a semiconductor photocathode in a transmission electron microscope, Makoto Kuwahara et. al).

In the present embodiment, the semiconductor film having the strained superlattice structure is used as the photocathode 18 by using the above technique. In case that a spin of electron is not important, the superlattice structure is not required, and a GaAs film, an AlGaAs film, an InGaAs film or the like are usable.

In order to implement the transferability described above, the following conditions are employed.

A thickness of the semiconductor film is set to be smaller than a value of multiplication of a coherent relaxation time of electrons in the semiconductor film (time to maintain the coherence of the electrons in the semiconductor) and a moving speed of the electrons in the semiconductor film. That is, the electrons pass through the semiconductor film within the coherent relaxation time. The semiconductor film satisfying the above relationship is as small as about 100 nm, and the laser 14 passes through the semiconductor film. When the semiconductor film is irradiated with the laser, the electrons are moved from various places inside the thickness of the semiconductor film and are emitted from the NEA surface regardless of whether the back surface or the front surface of the semiconductor film is irradiated. Electrons requiring the maximum moving time before emission from the NEA surface are electrons moving from the back surface of the semiconductor film. If the semiconductor film is thinner than the value obtained by multiplying the coherent relaxation time of the electrons in the semiconductor film by the moving speed of the electrons in the semiconductor film, even the electrons that require the maximum moving time pass through the semiconductor film within the coherent relaxation time, and are emitted from the NEA surface. When the electrons are emitted from the NEA surface within the electron coherent relaxation time, the spatial distribution of phase of the laser 14 is transferred to the spatial distribution of phase of the electron wave 24.

In addition, LO phonon scattering has a great effect on the relaxation time of the electrons in the semiconductor film, and the relaxation time of the electrons whose energy exceed 36 meV (with the bottom of the conduction band of the semiconductor as the reference of the energy level) is shortened by the LO phonon scattering. Conversely, electrons whose energy not exceeding 36 meV are less likely to be affected by the LO phonon scattering, and have a long relaxation time. In the present embodiment, by using the NEA surface that emits the electrons having the energy of 36 meV in the semiconductor film into the vacuum, a relationship in which the electrons pass through the semiconductor film within the coherent relaxation time is obtained.

If a film that implements negative electron affinity is used, there is no problem since the electrons in an energy range of 36 meV from the bottom of the conduction band are emitted into the vacuum. In case of not using a film for lowering vacuum level, the electrons in the semiconductor at the energy of 36 meV from the bottom of the conduction band are not emitted into the vacuum. The NEA film enhances to emit the electrons into the vacuum, hence it is not necessarily limited to one having the negative electron affinity, and any film may be employed, such as a film that causes a vacuum level lower than the energy level higher by 36 meV from the bottom of the conduction band.

In case of not using the NEA surface, the electrons having long coherent relaxation time of 36 meV or less cannot be emitted from the photocathode 18. Transferability of the spatial distribution of phase will be obtained, if the semiconductor film is thinned and used in combination with the NEA film.

The spatial light phase modulator 12 of FIG. 1 has a structure in which a plurality of liquid crystal cells are two-dimensionally arranged, a magnitude of a voltage applied to each of the liquid crystal cells is controllable independently, and a magnitude of a phase delay generated while the laser passes through the liquid crystal cells can be independently controlled for each cell. That is, the phase is varying depending on a position in the cross section, if observing a cross section of the laser passing through the spatial light phase modulator 12. The spatial distribution of phase of the laser passing through the spatial light phase modulator 12 is not uniform, and the phase differs depending on its spatial positional relationship. The spatial light phase modulator 12 can be composed of combination of a liquid crystal panel that transmits the laser and a controller that controls the voltage applied to each cell of the liquid crystal panel.

When the back surface of the photocathode 18 is irradiated with the laser 14, the electron wave 24 is emitted from the front surface of the photocathode 18. Here, if the spatial distribution of phase of the laser 14 is not uniform, the spatial distribution is transferred to the electron wave. That is, the electron wave 24 whose spatial distribution of phase matches that of the laser 14 is emitted. The emitted electron wave is accelerated toward the sample by the electrode pairs 20 and 22.

The above shows the case of emitting the laser 14 whose phase is spatially modulated. However, in case of irradiating with a laser of which both a spatial distribution of phase and a spatial distribution of intensity are spatially modulated, an electron wave is emitted, that both a phase intensity distribution and a spatial distribution of intensity matches those of the laser. By combining the liquid crystal panel that can delay the phase of the transmitted laser and control a delay amount for each cell, and the liquid crystal panel that can control transmittance for each cell, the laser having both the spatial distribution of phase and the spatial distribution of intensity are spatially modulated will be obtained.

According to the spatial light phase modulator, it is possible to obtain a light having a spatial distribution of phase that changes with time, and light having both a spatial distribution of phase and a spatial distribution of intensity that change with time. By using the light, it is possible to obtain an electron wave having a spatial distribution of phase that changes with time, and an electron wave having both a spatial distribution of phase and a spatial distribution of intensity that change with time.

Further, if the semiconductor film has the strained superlattice structure and the laser is circularly polarized, the spin direction of the electrons emitted from the semiconductor film is controlled by the direction of the circularly polarized light. For instance, an electron wave with having a rightward spin preference can be obtained, an electron wave having a leftward spin preference can be obtained. It is also possible to perform spatial phase modulation on the polarized electron wave whose spin direction is polarized.

The apparatus of the present embodiment can obtain an electron wave having a phase that is spatially modulated and an electron wave having both a phase and an intensity that are spatially modulated. If necessary, in addition to the above properties, an electron wave having spatial distribution that changes with passage of time, or an electron wave having a specific preference of spin direction and having a modulated spatial distribution of phase and even a modulated time distribution can be obtained.

Figure 2:
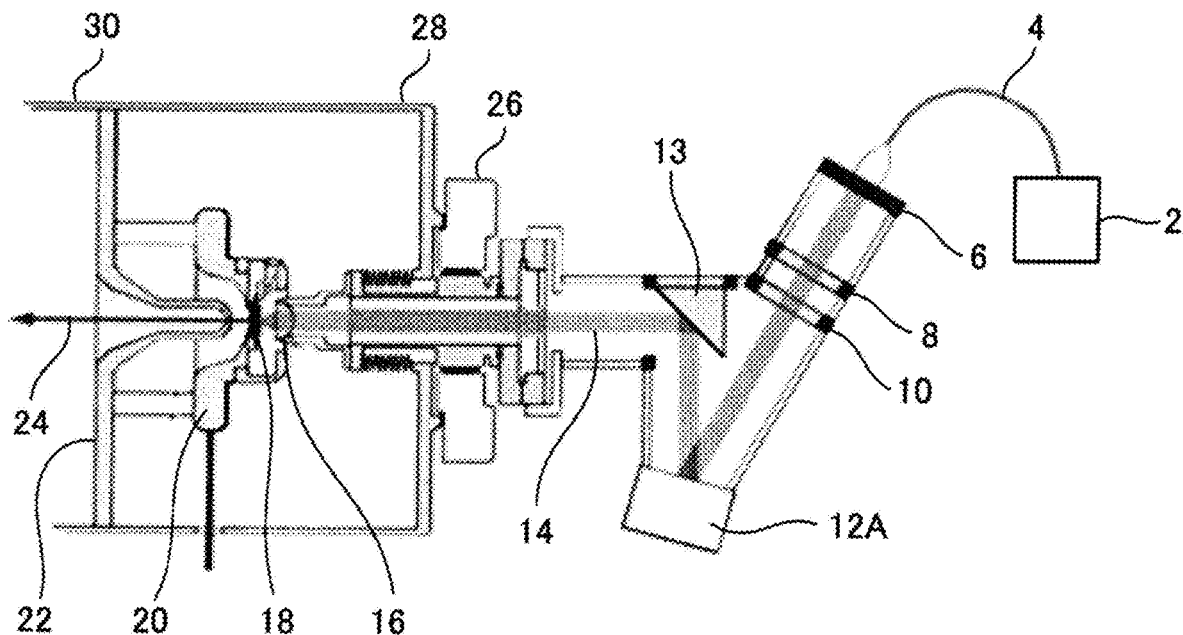
FIG. 2 shows an apparatus for generating a spatially phase modulated electron wave according to Embodiment 2.

Spatial light phase modulators include reflective ones. In this case, as shown in FIG. 2, laser reflected by a spatial light phase modulator 12A (spatial phase modulated) is reflected by a reflection mirror 13 and is directed toward the photocathode 18. For example, the LCOS-SLM X10468 series produced by Hamamatsu Photonics can be used as the reflective spatial light phase modulator 12A.

Figure 12A:
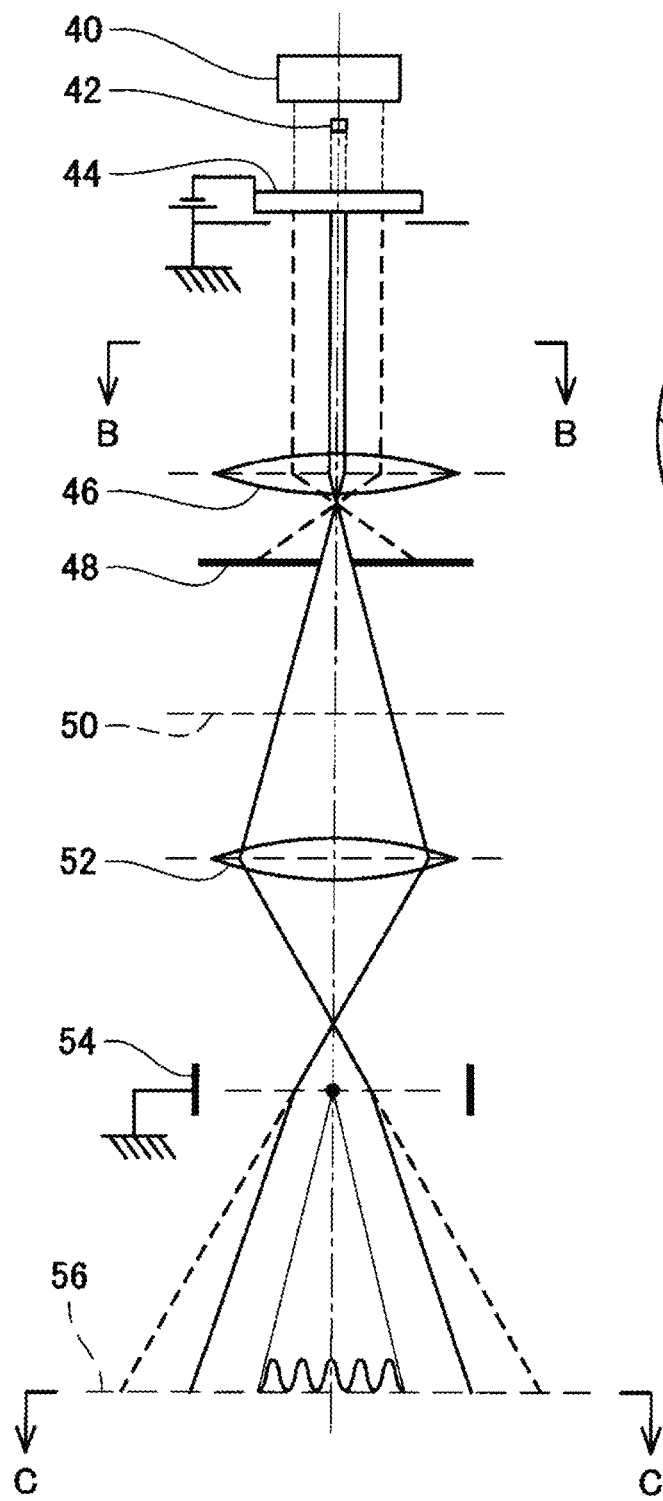
FIGS. 12A to 12C show an apparatus for the experiment confirming that a spatially phase modulated electron wave have obtained.
Figure 12B:
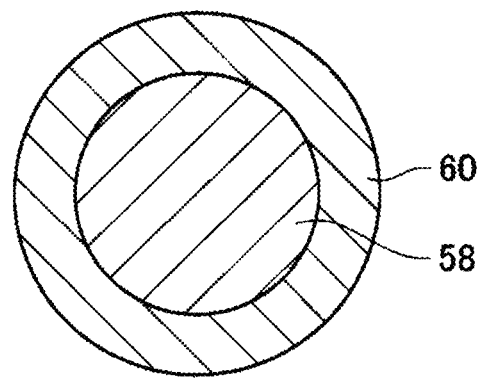
Figure 12C:
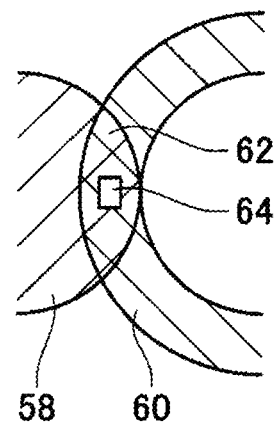

FIG. 12 shows an experimental apparatus verified as having generated a spatial phase controlled electron wave with a combination of a spatial light phase modulator 42 and a photocathode 44.

In FIG. 12(A), a reference numeral 40 denotes a laser radiating apparatus, 42 denotes a spatial light phase modulator, 44 denotes a photocathode, 46 denotes a condenser lens, 48 denotes a diaphragm with an opening formed, 50 denotes a surface on which a sample is placed, 52 denotes a projection lens, 54 denotes a biprism, and 56 denotes a projection surface.

The laser radiating apparatus 40 outputs laser having a uniform phase (meaning that the phase when observed in a cross section orthogonal to a travelling direction is a constant phase regardless of the location, and referred to as plane wave laser). As shown in FIGS. 13 (A1) and (A2), the spatial light phase modulator 42 has a constant phase on an axis extending in a radial direction from a beam center, and has a relationship such that, with respect to a phase on a radius at a predetermined rotation angle, a phase on the radius at an angle of 90 degrees is delayed by $1/2 \cdot \pi$, a phase on the radius at an angle of 180 degrees is delayed by $\pi$, and a phase on the radius at an angle of 270 degrees is delayed by $3/2 \cdot \pi$. An angle formed by the radiuses and the delay amount of the phase are in a proportional relationship. A direction of the radius without phase delay rotates with respect to space. (A2) shows a phase after a predetermined time has passed from the state of (A1), and shows that the phase is rotated by $\theta$ during that time. Such spatially phase modulated laser is referred to as vortex light.

A lower surface of the photocathode (semiconductor film) 44 is coated with an NEA film, and when the laser is incoming to an upper surface of the photocathode 44, an electron wave is emitted from the NEA film. The electron wave is directed downward by an acceleration apparatus.

The spatial light phase modulator 42 is placed adjacent to the center of an optical axis, and a peripheral portion of the laser does not pass through the spatial light phase modulator 42. Therefore, the vortex light enters the upper surface of the photocathode 44 near the center of the optical axis, and the plane wave laser enters the upper surface of the photocathode 44 at a position away from the optical axis.

The photocathode 44 transfers the phase of the laser to the electron wave being emitted. As a result, near the center of the optical axis, the vortex electron wave having the rotating phase shown in FIGS. 13(A1) and (A2) is emitted, and the plane wave electron wave is emitted in the peripheral portion. B-B of FIG. 12 shows that, in a cross section of the electron wave beam, a vortex electron wave 58 travels near the center of the optical axis and a plane wave electron wave 60 travels in the periphery.

A biprism 54 displaces the traveling direction of the electron wave traveling on the right side of the optical axis to the left side, and displaces the traveling direction of the electron wave traveling on the left side of the optical axis to the right side. When an electron wave having the cross section B-B of FIG. 12 passes through the biprism 54, for example, the traveling direction of the vortex electron wave 58 traveling on the right side of the optical axis is displaced to the left side, and the traveling direction of the plane wave electron wave 60 traveling on the left side of the optical axis is displaced to the right side, and as a result, as shown in C-C of FIG. 12, at a specific position 62 on the projection surface 56, both the vortex electron wave 58 and the plane wave electron wave 60 are input and produce interference fringes. A reference numeral 64 in C-C of FIG. 12 indicates a capturing range of the interference fringes.

Figure 13A:
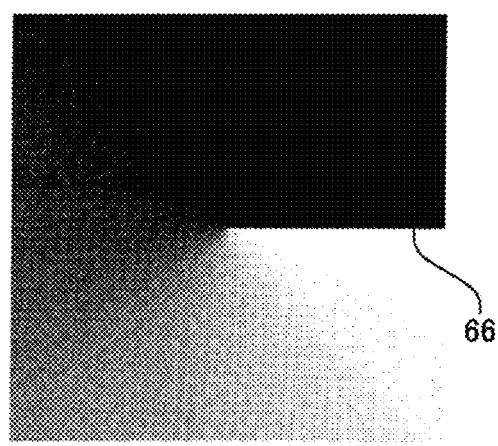
FIGS. 13A to 13E show a result obtained by the apparatus of FIG. 12.
Figure 13B:
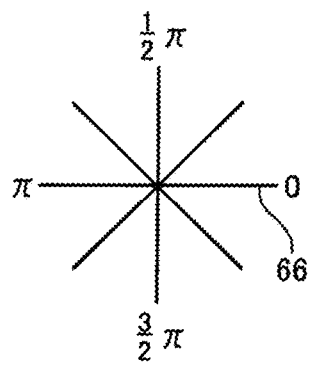
Figure 13C:
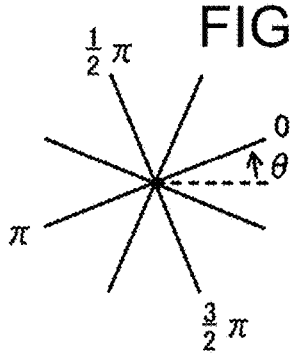
Figure 13D:
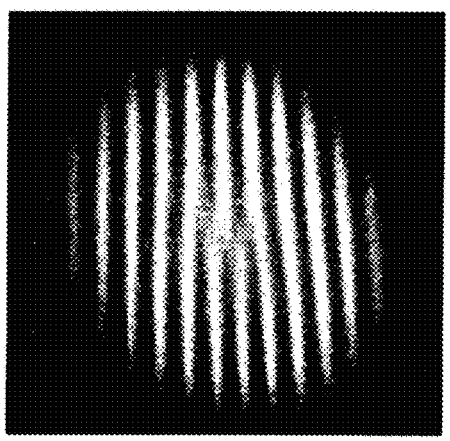
Figure 13E:
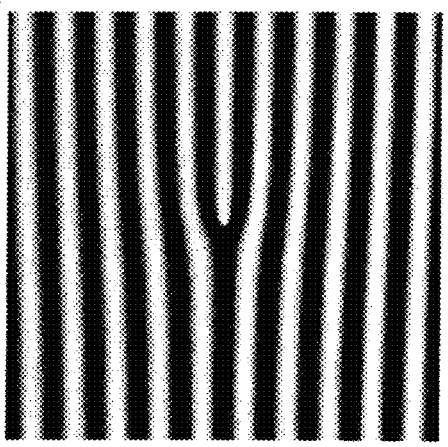

FIG. 13(B) shows observed interference fringes. On the other hand, FIG. 13(C) shows a pattern obtained by calculating the interference fringes obtained by the vortex electron wave 58 and the plane wave electron wave 60. (B) and (C) correspond well, and it is confirmed that when spatial light phase modulated vortex laser by the spatial light phase modulator 42 is input to the photocathode 44, the vortex electron wave is output from the photocathode 44. The spatial distribution and the time distribution of the phase of the vortex laser are transferred to the spatial distribution and the time distribution of the phase of the vortex electron wave, and the two match each other.

In FIGS. 1 and 2, the back surface of the photocathode 18 (semiconductor film on which the NEA surface is formed) is irradiated with the laser 14, but as shown in FIGS. 3 to 11, the front surface of the photocathode 18 may also be irradiated with laser. In FIGS. 3 to 11, illustration of the laser radiating apparatus 2, the optical fiber 4, and the collimator lens 6 is omitted. The same reference numerals denote the same members, and a repetitive description thereof is omitted.

Figure 3:
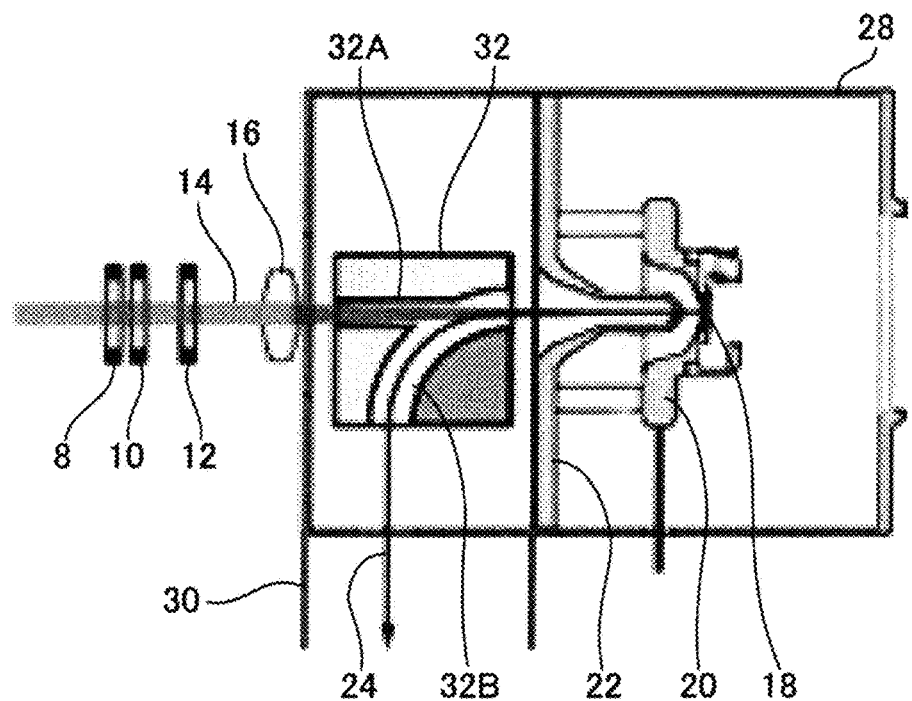
FIG. 3 shows an apparatus for generating a spatially phase modulated electron wave according to Embodiment 3.

In FIG. 3, an electrostatic deflector 32 is added between the optical system through which the laser passes and the casing 28 of the electron gun portion. The deflector 32 is provided with a through hole 32A through which the laser 14 passes. A traveling direction of the electron wave 24 is bent downward by the deflector 32, and is sent to the lens barrel 30 of the electron microscope (extending downward).

Figure 4:
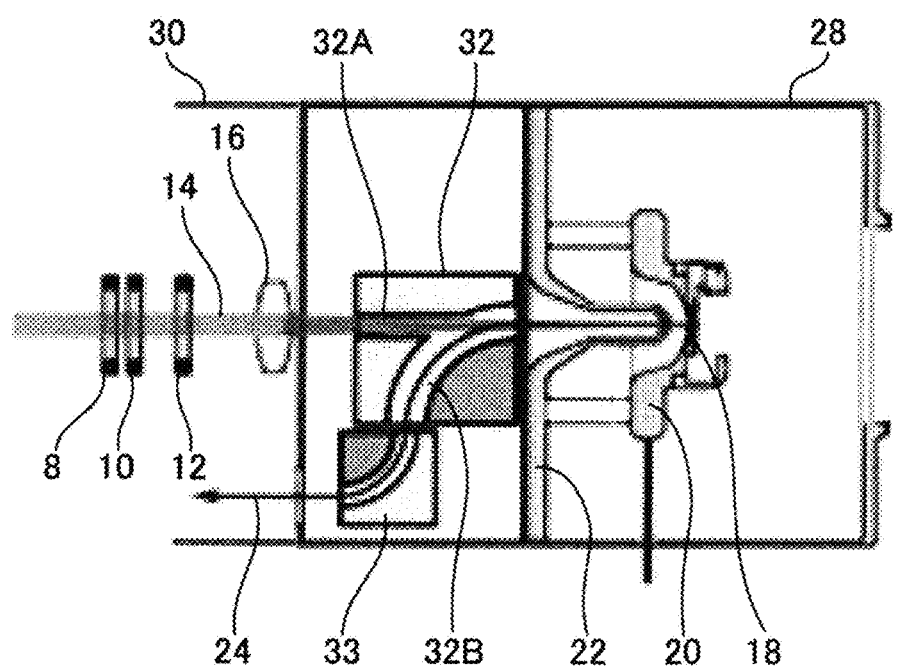
FIG. 4 shows an apparatus for generating a spatially phase modulated electron wave according to Embodiment 4.

As shown in FIG. 4, when the lens barrel 30 extends in a left-right direction, a deflector 33 is added.

Figure 5:
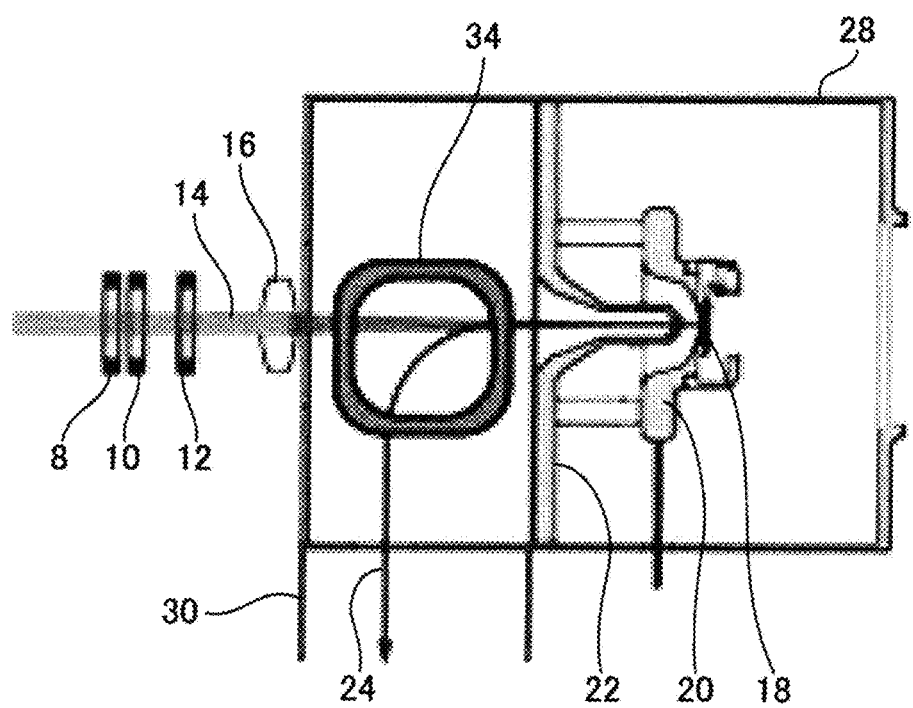
FIG. 5 shows an apparatus for generating a spatially phase modulated electron wave according to Embodiment 5.

As shown in FIG. 5, a deflection electromagnet 34 may be used instead of the electrostatic type deflector. A gap through which the laser 24 passes is formed in the deflection electromagnet 34.

Figure 6:
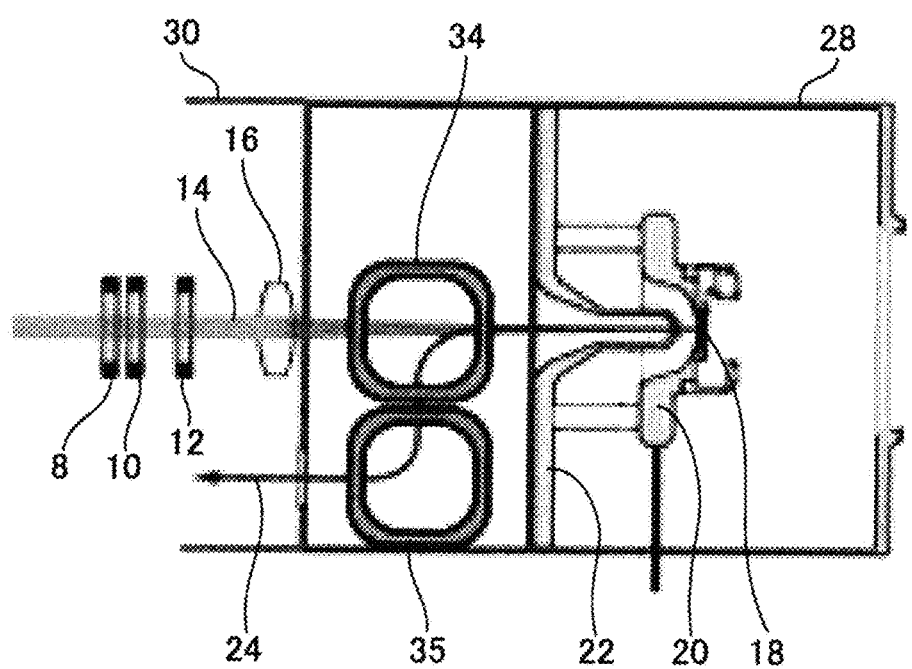
FIG. 6 shows an apparatus for generating a spatially phase modulated electron wave according to Embodiment 6.

FIG. 6 corresponds to FIG. 4 and additionally includes a deflection electromagnet 35.

Figure 7:
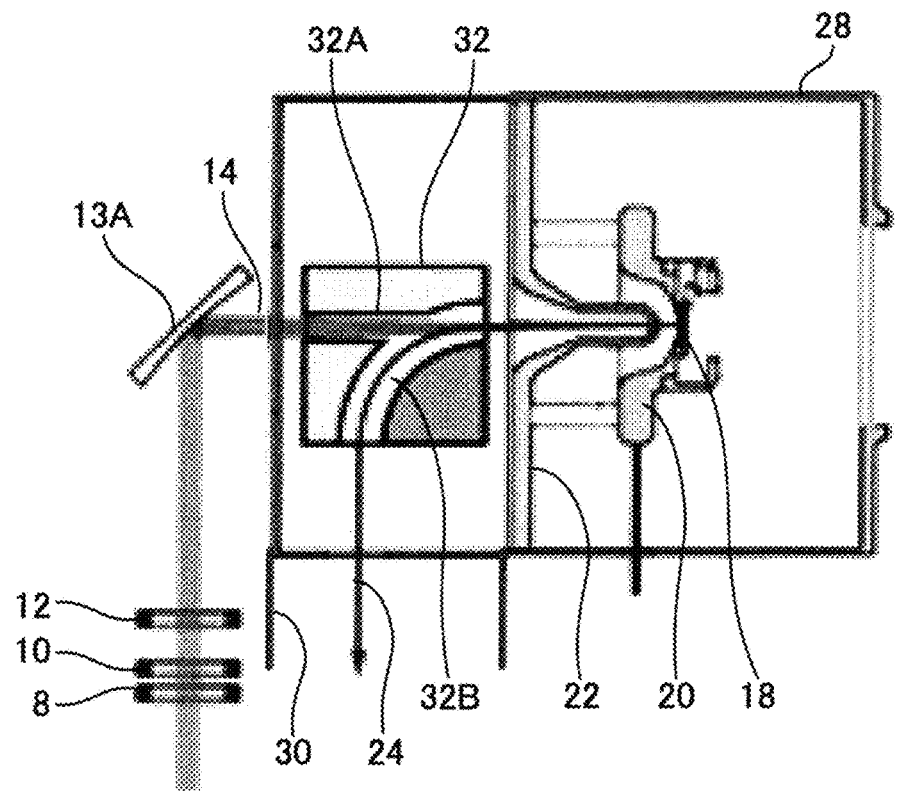
FIG. 7 shows an apparatus for generating a spatially phase modulated electron wave according to Embodiment 7.

As shown in FIG. 7, a reflector 13A may be inserted into the path of the laser. When a concave mirror is used for the reflector 13A, it is possible to obtain a relationship in which the laser is focused on a specific position on the front surface of the photocathode 18 and a focusing lens can be eliminated.

Figure 8:
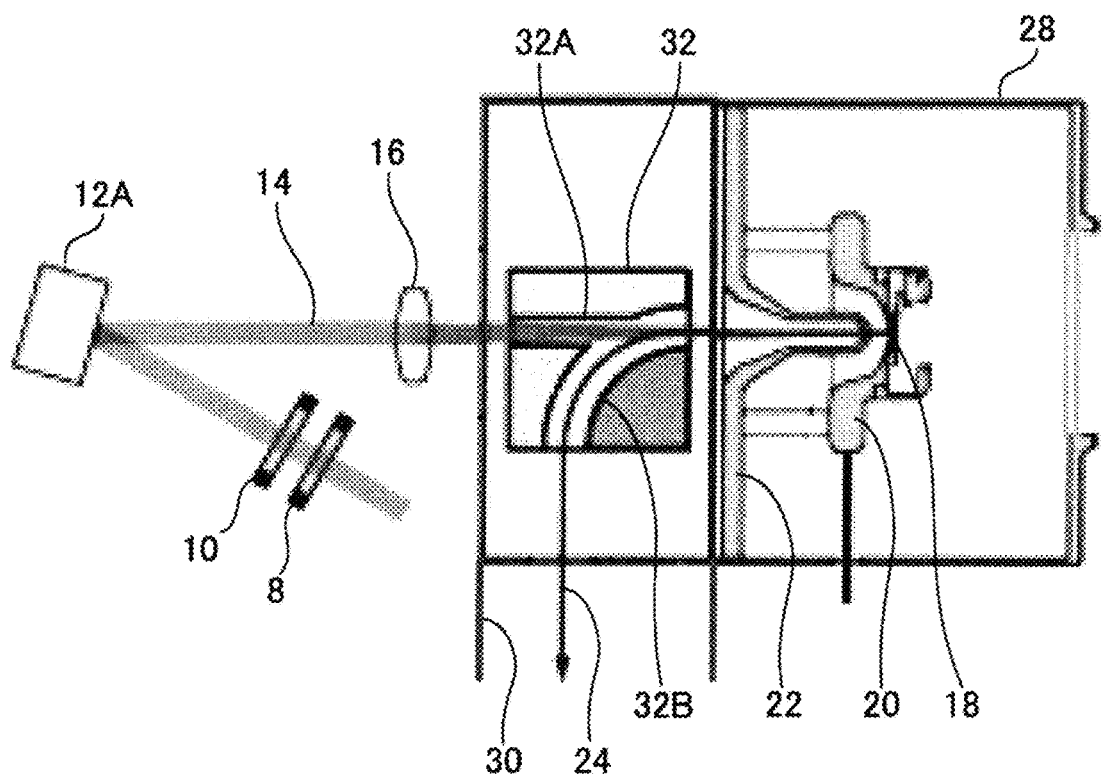
FIG. 8 shows an apparatus for generating a spatially phase modulated electron wave according to Embodiment 8.

As shown in FIG. 8, a reflective spatial light phase modulator 12A may be used.

Figure 9:
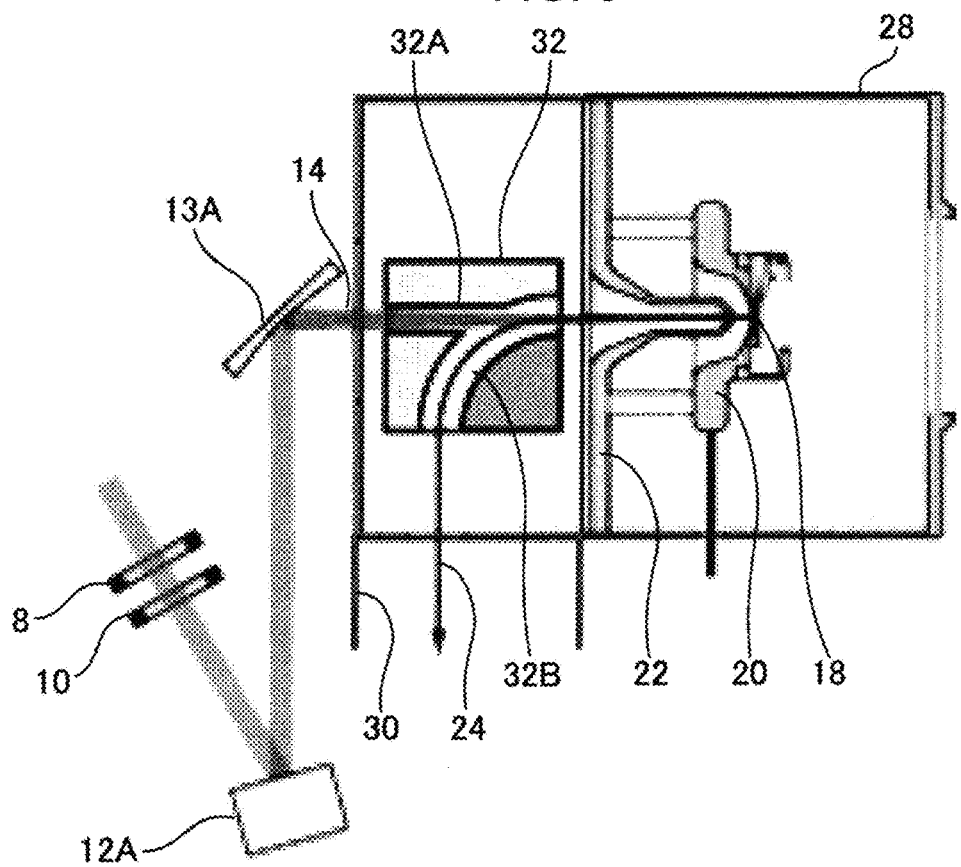
FIG. 9 shows an apparatus for generating a spatially phase modulated electron wave according to Embodiment 9.

As shown in FIG. 9, the concave mirror reflector 13A and the reflective spatial light phase modulator 12A may be used in combination.

Figure 10:
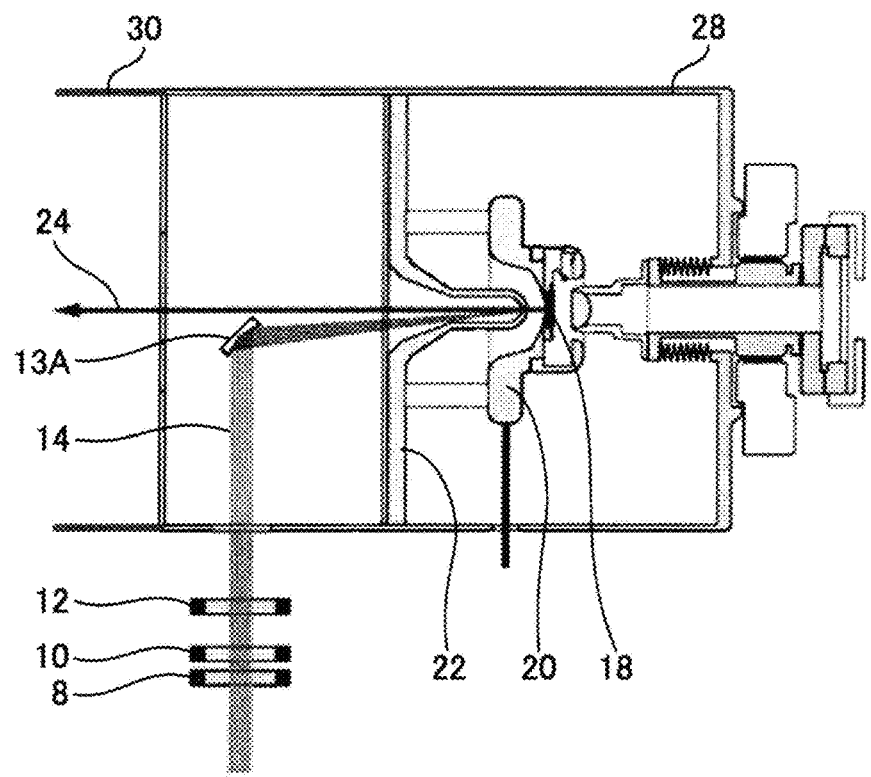
FIG. 10 shows an apparatus for generating a spatially phase modulated electron wave according to Embodiment 10.

As shown in FIG. 10, the laser 14 may be emitted to the photocathode 18 from an oblique direction.

Figure 11:
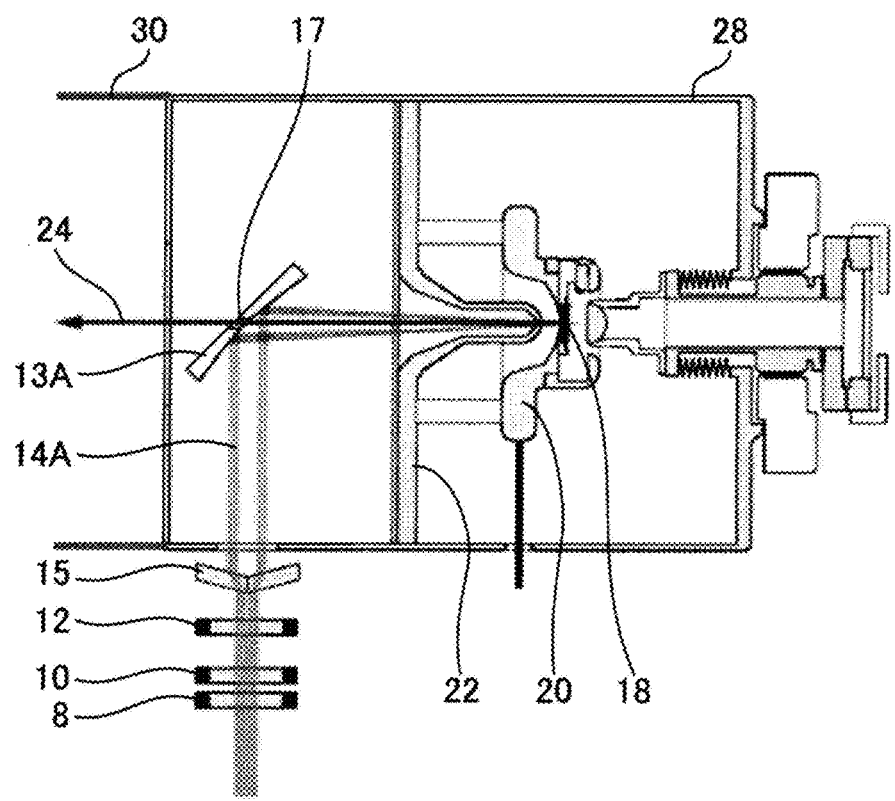
FIG. 11 shows an apparatus for generating a spatially phase modulated electron wave according to Embodiment 11.

As shown in FIG. 11, the concave mirror reflector 13A provided with a through hole 17 through which the electron wave passes may be used. A reference numeral 15 denotes an optical biprism which converts a laser 14A having an intensity distributed in a ring-shaped range when observing the cross section. By the concave mirror reflector 13A, it is possible to obtain a relationship such that the ring-shaped laser is focused at the specific position on the front surface of the photocathode 18.

There is no particular restriction as to whether the optical system is arranged in the vacuum or in the atmosphere, and a part of optical elements may be arranged in the vacuum and other optical elements may be arranged in the atmosphere.

When the above electron wave is obtained, the following various usage are enabled.

(High Resolution of Electron Microscope by Structured Illumination Method)

In an optical microscope, it is known that a resolution can be increased to a level exceeding a diffraction limit of light by using a light having a modulated spatial distribution of intensity (for example, Yoshio Oikawa, Super Resolution Microscope Technology and Applied Microscope pp. 238-240, Vol. 47, No. 4, 2012). The same can be done in an electron microscope. The resolution of the electron microscope can be increased to a level exceeding the diffraction limit of the electron wave if an electron wave having a modulated spatial distribution of intensity is available.

It is possible to perform a structured illumination method using Moire fringes obtained by STEM scanning lines and crystal lattice (Kondo, High Resolution Strained Analysis Method Using Moire Fringes By STEM Scanning Lines And Crystal Lattice, Microscope, Vol. 49, No. 3, 2014). In principle, it is not impossible to implement the structured illumination method with a transmission electron microscope by utilizing an electron wave with a scanning pattern. However, in practice, complicated scanning signal processing and detector synchronization are required, which is not easy. According to the present technique, since it is possible to obtain an electron wave having a stripe-shaped spatial distribution of intensity, that is, an electron wave having a scanning pattern, the structured illumination method can be introduced into a transmission electron microscope. The spatial distribution of phase of the electron wave emitted to the sample that simplifies or speeds up Fourier calculation for reconstructing a fine structure based on a moire pattern can be selected. Alternatively, the spatial distribution of phase may be adjusted to one for generating an electron wave having a stripe-shaped spatial distribution of intensity by interference.

When comparing the structured illumination method using TEM and a structured proof method using STEM, since only one capturing is required according to the former method, types and capturing conditions of an available sample are relaxed. Further, a technique for further increasing the resolution by capturing a plurality of times while changing a stripe direction of the electron wave emitted to the sample is known, but according to the present technique, the stripe direction can be easily changed by the spatial light phase modulator. The spatial light phase modulator itself can also be rotated.

(High Resolution of Electron Microscope by Improvement of Spherical Aberration)

When the electron wave is converged by an electron wave lens, spherical aberration occurs, which is a big problem of the electron microscope (for example, Nobuo Tanaka, Current Status and Future Prospects of Aberration-corrected TEM/STEM Microscope pp. 175-180, Vol. 46, No. 3, 2011, and Nobuo Tanaka, Resolution Improvement of High Resolution Electron Microscopy by Spherical Aberration Correction Journal of the Crystallography of Japan pp 20-25, Vol. 47, No. 1, 2005). With an electron wave having a modulated spatial distribution of phase, it becomes possible to minimize the aberration by compensating lens aberration. It is possible to observe the sample under a state that the lens aberration is minimized, and the resolution is increased.

Figure 14A:
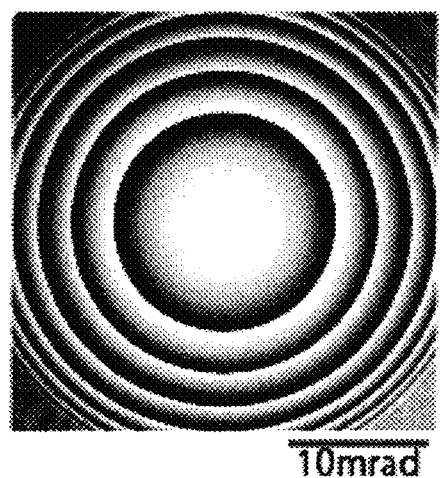
FIGS. 14A and 14B show an example of the experiment showing that spherical aberration is reduced by using the spatially phase modulated electron wave.
Figure 14B:
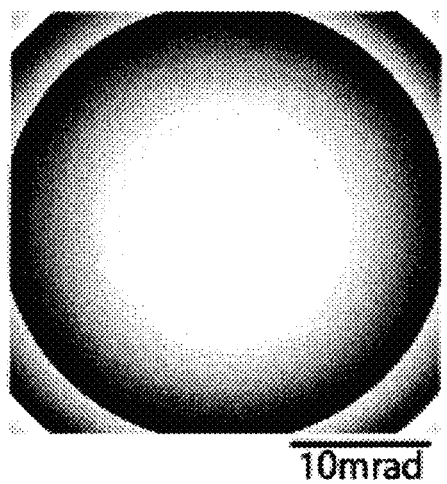

FIG. 14 shows a Ronchigram showing quality of a convergence point by an electron wave lens. (A) shows a Ronchigram in the case that a plane wave electron wave is converged. It can be seen that the spatial distribution of phase is uneven due to the electron wave lens. (B) shows a Ronchigram obtained by following procedure, obtaining the spatial distribution of phase caused by the electron wave lens in advance (that is, obtaining the phase distribution of (A) in advance), generating a phase distribution that can offset (cancel) the phase distribution caused by the electron wave lens with using the spatial light phase modulator, and converging the electron wave with the electron wave lens, which is obtained by the laser from the spatial light phase modulator. Clearly, the Ronchigram shown in (B) has a magnification clearly higher than magnification of the Ronchigram shown in (A), therefore it is confirmed that the aberration is reduced by converging after the spatial phase modulation.

(Elimination of Spherical Aberration Correction Apparatus)

With the utilization of the electron wave that the spatial distribution of phase is modulated, a lens that corrects the lens aberration becomes unnecessary, the electron microscope can be downsized, and a high resolution electron microscope can be provided at low cost. At present, a spherical aberration corrector is extremely expensive, which hinders the spread of the high resolution electron microscope.

(Contrast Improvement)

A substance formed of a light element such as a polymer or a biological sample has a problem that a contrast of the transmission electron microscope image is low. In order to increase the contrast, a technique is known in which a phase plate is arranged in a part of a traveling path of the electron wave. For example, it is possible to perform virus observation by using a ring-shaped carbon film having a central aperture in the phase plate (Masami Yamaguchi et. al., Virus Observation by Phase Difference Electron Microscope Microscope pp. 115-120, Vol. 43, No. 2, 2008). A phase delay does not occur in the electron wave passing through the central aperture, whereas a phase of the electron wave passing through the carbon film is delayed by 90 degrees. That is, when a cross section of the electron wave is observed, an electron wave having a phase difference of 90 degrees between a central portion and a peripheral portion is used. By using interference between the two portions, it is possible to enhance the contrast.

There is a problem on the phase plate, such as damage or charge up due to irradiation of the electron wave, and the phase plate cannot be used for a long time. In general, several phase plates are installed in the vacuum of the electron microscope, and are used while being replaced each time the phase plate breaks. When the installed phase plates are used up, it is necessary to break the vacuum and replace it with new phase plates. Further, since the charge-up or the damage occurs, time for stable measurement is very limited. The present technique eliminates the problem.

(Improvement of Phase Retrieval Method)

A phase retrieval method that extracts intensity information and phase information numerically from the transmission electron microscope image is known. According to the phase retrieval method, it is not necessary to generate interference fringes for electron wave holography, and phase information can be extracted from a normal microscope image. In the phase retrieval method, by limiting an irradiation region using a circular hole mask and the like during electron wave irradiation, spatial information of the electron wave irradiation region is given as known information to a constraint condition during numerical calculation (for example, JP-A-2006-331901), and a solution that satisfies the constraint condition is obtained by a Fourier iterative phase retrieval method (Takahashi et. al., Improvement of Fourier Iterative Method for Phase Retrieval, pp. 39-45, Optics, Vol. 32, No. 1, 2003). In the above method, a fine and highly accurate mask is required. In addition, a large amount of calculation is required until the solution that satisfies the constraint condition is obtained by the Fourier iterative phase retrieval method.

According to the present technique, when generating an electron wave, it is possible to generate an electron wave having a known spatial structure. Further, since the spatial phase information can be superimposed, only the spatial distribution of intensity information is used as the constraint condition in the related art, whereas the phase spatial information can also be added to the constraint condition, which is excepted to accelerate the convergence of the numerical calculation, and improve a calculation speed.

(Improvement of Image Retrieval Technique by Compressed Sensing)

An image retrieval method by compressed sensing that restores an original image from a sparse image is known. The technique requires random sampling (Kazufumi Mimura, Compressed sensing-Reconstruction of Sparse Information and Algorithm Thereof-, RIMS Kokyuroku, Vol. 1803, pp. 26-56, 2012, and Daisuke Kozaki et. al., Restoration of Magnetic Resonance Image by Adaptive Compressed sensing Algorithm, pp. 1-4, 306th Research Meeting of Society of Instrument and Control Engineers Tohoku Branch (2016 Dec. 10) Document number 306-9, JP-T-2016-538681).

According to the invention, since random spatial phase modulation and spatial intensity modulation can be added to the electron wave, an electron microscope image capable of image retrieval can be easily obtained. By limiting the irradiation region in addition to the random sampling, calculation time required for the image retrieval is shortened. Further, by implementing a neural network, deep learning, and machine learning, a calculation speed of the image retrieval and accuracy thereof are expected to be further improved.

Accordingly, low dose (low electron wave irradiation amount) observation is possible, and damage-less observation of fragile samples such as biomolecules and macromolecules becomes easier. Furthermore, since problems such as the charge-up can be avoided, stable observation can be performed even without using a conductive substance.

(Quantum Information Processing)

In order to generate a vortex electron wave (Vortex beam) with an angular momentum, in the related art, a fork mask, a phase plate, or the like have to be installed on an electron wave traveling path (Akira Saito et. al., Generation, Propagation, and Interference of Electron Waves Having Spiral Wavefront pp. 39-46, Microscope Vol. 48, No. 1, 2013). The technique has various problems, such as a problem that the intensity of the electron wave is reduced, a problem that it is necessary to create a very fine mask with high accuracy, a problem that the mask is charged up and the phase is disturbed, and a problem that a plurality of vortex beams having different angular momentums are simultaneously generated.

In the invention, since it is possible to generate a spatially phase modulated electron wave that changes with time, it is possible to generate the vortex beam directly from the photocathode and the above problems do not occur.

Further, since an LG light beam having a single angular momentum can be generated by the spatial light phase modulator, it is possible to prevent generation of a high-order vortex beam by a higher-order LG light beam.

When LG light beams that respectively generate right-handed vortex and left-handed vortex are in a quantum entangled state (entanglement state), an electron wave vortex beam that maintains the entanglement state can be generated. In the field of quantum information, quantum communication using the entangled LG light beam is being developed, and it is possible to store information in a vacuum tube by transferring the beam to an electron wave and extracting it into a vacuum. This makes it possible to use as a temporary storage function. It is also possible to store information held by quantum light. It is also possible to observe the state of the sample by observing other light while irradiating the sample with the vortex beam generated from one light of the LG light beam in the entanglement state. In this case, it is possible to know the state in which the sample is observed by an electron beam by an optical measurement technique instead of the electron wave. The state of the sample can be observed.

(Control of Exposure Pattern of Electron Wave)

As described in the item "beam shaping" in https://www.hamamatsu.com/resources/pdf/ssd/12_handbook.pdf, it is possible to obtain a light having a modulated spatial distribution of intensity (beam shaped light) by using spatial phase modulation light and interference phenomenon. According to the present technique, by irradiating the semiconductor film with the beam shaped light, it is possible to obtain a beam shaped electron wave, that is, an electron wave having a modulated spatial distribution of intensity.

When the electron wave having a modulated spatial distribution of intensity is applied to an electron wave drawing apparatus, it is possible to expose a desired pattern region by one shot, or to expose multiple points with one shot, and scanning of the electron wave is eliminated. A structure processing method such as a 3D printer drawing with the electron wave can be easily implemented. In addition, it can also be used to write data into an irradiation sample and to read data.

(Use for Welding, Fusing, Etc.)

It is possible to perform welding and fusing by using an electron wave having a desired spatial distribution of intensity.

(Particle Movement)

A particle can be moved by matching a convergence point of an electron wave with the particle and moving a position of the convergence point. The same phenomenon as optical tweezers is possible with the electron wave. In particular, a vortex electron wave may be used to rotate the particle at the convergence point. Electron wave tweezers that can rotate a particle as well as moving a particle can be obtained.

(Application to Electromagnetic Wave)

Further, by incorporating the electron wave generation apparatus with a microwave or a terahertz wave generation apparatus, it is possible to generate a spatial phase modulated electromagnetic wave, and to provide an arbitrary spatial structure that exceeds a microarray type (Spindt type) electron source and simplicity.

While specific examples of the invention have been described in detail, these are merely examples and do not limit the scope of the claims. The techniques described in the claims include various modifications and changes to the specific examples illustrated above.

Further, the technical elements described in the present specification or the drawings exhibit technical utility alone or in various combinations, and are not limited to the combinations described in the claims at the time of filing. Further, the techniques illustrated in the present specification or the drawings achieve a plurality of objects at the same time, and have technical utility by achieving one of the objects.

REFERENCE SIGNS LIST 2 laser radiating apparatus
4 optical fiber
6 collimator lens
8, 10 deflection optical element
12, 12A spatial light phase modulator
14 spatial phase modulated laser
16 focusing lens
18 photocathode
20, 22 electrode pair
24 spatially phase modulated electron wave (electron wave)
26 housing
28 casing of electron gun portion
30 lens barrel
32, 33 electron wave deflection apparatus (electrostatic type)
34, 35 electron wave deflection apparatus (electromagnetic type)
40 laser radiating apparatus
42 spatial light phase modulator
44 photocathode
46 condenser lens
48 diaphragm with opening formed
50 surface to place sample
52 projection lens
54 biprism
56 projection surface
58 vortex electron wave
60 plane wave electron wave

The invention claimed is:

1. An electron microscope comprising:
a laser radiating apparatus that radiates a laser;
a photocathode configured to emit an electron wave having modulated spatial distribution of phase by irradiation of a spatially phase modulated laser;
an electron wave lens configured to converge the electron wave emitted from the photocathode;
a spatial light phase modulator configured to generate first spatial distribution of phase to the laser that cancels second spatial distribution of phase caused by the electron wave lens, and configured to radiate the spatially phase modulated laser;
whereby, a lens aberration caused by the electron wave lens is reduced.

2. An electron microscope according to claim 1, said spatial light phase modulator further comprising:
a liquid crystal panel having a plurality of liquid crystal cells that transmits the laser; and
a controller that controls voltage applied to each of the liquid crystal cells.

3. An electron microscope according to claim 1, said spatial light phase modulator further comprising:
a dielectric that transmits the laser.

4. An electron microscope according to claim 1, the photocathode further comprising:
- a semiconductor film with thickness less than or equal 100 nm;
- a NEA film coated on electron wave emitting surface of the semiconductor film.

5. An electron microscope according to claim 1, wherein, the spatial light phase modulator further modulates spatial distribution of intensity of the laser in generating the first spatial distribution of phase.

6. An electron microscope according to claim 1, wherein the semiconductor film is composed of a semiconductor film having a strained superlattice structure.

7. An electron microscope according to claim 1, wherein, the semiconductor film is composed of a film including one of a GaAs film, an AlGaAs film, and an InGaAs film.

8. An electron microscope according to claim 1, wherein, the lens aberration is a spherical aberration.

\* \* \* \* \*